United States Patent
Gieskes

(10) Patent No.: US 8,898,893 B2
(45) Date of Patent: Dec. 2, 2014

(54) METHOD AND APPARATUS FOR APPLYING FLUID DURING A PLACEMENT CYCLE

(75) Inventor: Koenraad Gieskes, Deposit, NY (US)

(73) Assignee: Universal Instruments Corporation, Conklin, NY (US)

( * ) Notice: Subject to any disclaimer, the term of this patent is extended or adjusted under 35 U.S.C. 154(b) by 600 days.

(21) Appl. No.: 12/968,385

(22) Filed: Dec. 15, 2010

(65) Prior Publication Data
US 2012/0152358 A1    Jun. 21, 2012

(51) Int. Cl.
*H05K 3/30* (2006.01)
*B23P 19/00* (2006.01)
*H05K 13/04* (2006.01)

(52) U.S. Cl.
CPC ........ *H05K 13/0452* (2013.01); *H05K 13/0469* (2013.01)
USPC .................. 29/832; 29/833; 29/834; 29/739; 29/740; 29/741

(58) Field of Classification Search
CPC .......... H05K 13/0469; H05K 13/0452; H01L 2924/01079; H01R 43/205
USPC .................... 29/832, 833, 834, 739, 740, 741
See application file for complete search history.

(56) References Cited

U.S. PATENT DOCUMENTS

| | | | | |
|---|---|---|---|---|
| 4,794,689 A * | 1/1989 | Seno et al. | ...... | 29/740 |
| 5,345,514 A * | 9/1994 | Mahdavieh et al. | .......... | 382/152 |
| 5,383,270 A * | 1/1995 | Iwatsuka et al. | ................ | 29/840 |
| 5,445,313 A * | 8/1995 | Boyd et al. | ................. | 228/248.1 |
| 6,092,713 A * | 7/2000 | Kim | .......................... | 228/180.21 |
| 6,879,869 B2 * | 4/2005 | Kou | ................................ | 700/117 |
| 7,007,377 B2 * | 3/2006 | Noda et al. | ....................... | 29/833 |
| 7,188,409 B2 * | 3/2007 | Gieskes | .......................... | 29/833 |
| 2003/0046812 A1 * | 3/2003 | Terada et al. | ................... | 29/833 |
| 2006/0185157 A1 * | 8/2006 | Shida et al. | ..................... | 29/740 |
| 2012/0152358 A1 * | 6/2012 | Gieskes | ............................ | 137/1 |

OTHER PUBLICATIONS

International Search Report and the Written Opinion; PCT/US2011/064536; Int'l File Date: Dec. 13, 2011; Universal Instruments Corporation; 10 pages.

* cited by examiner

*Primary Examiner* — David Angwin
(74) *Attorney, Agent, or Firm* — Schmeiser, Olsen & Watts, LLP

(57) ABSTRACT

Disclosed herein is a method for applying a fluid to a component during a placement cycle. The method includes providing a component placement machine including a housing having a frame attached thereto, the frame having a pick and place head. The method includes providing a fluid application station contiguous with the housing and adapted to apply fluid to the component, moving the housing to a pick location, picking the component from a supply of components using the pick and place head, moving the housing to a location, applying fluid to the picked component, and placing the picked component with the fluid applied onto the printed circuit board at the location. The fluid application step is accomplished during the moving step or placing step. The method may further include repeating the steps for another component where the fluid application step is accomplished during the repeated picking step of the additional component.

10 Claims, 7 Drawing Sheets

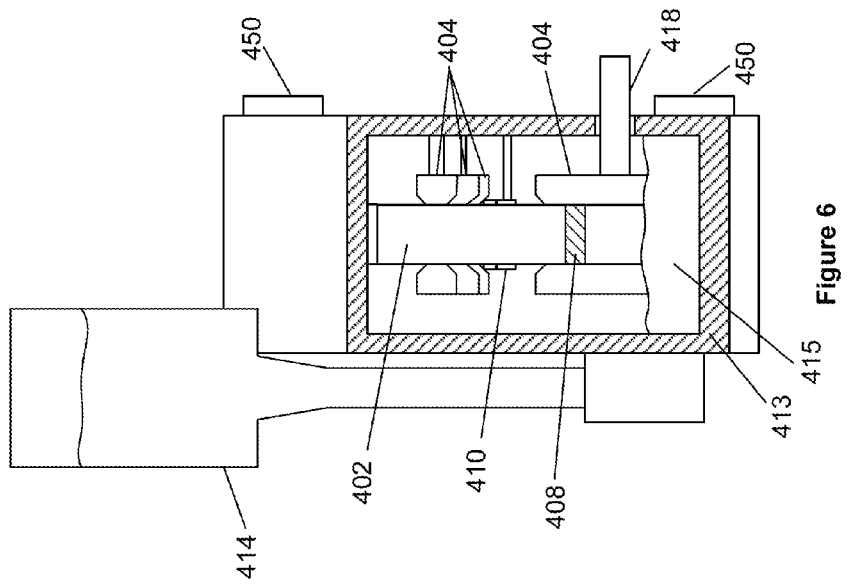
Figure 6
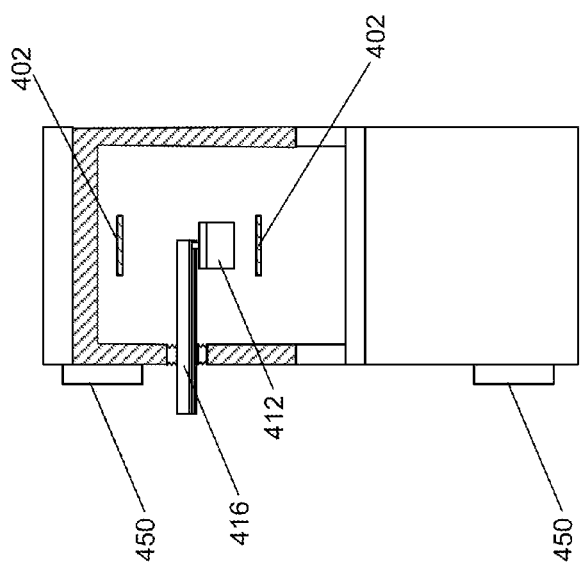
Figure 5
Figure 8
Figure 7

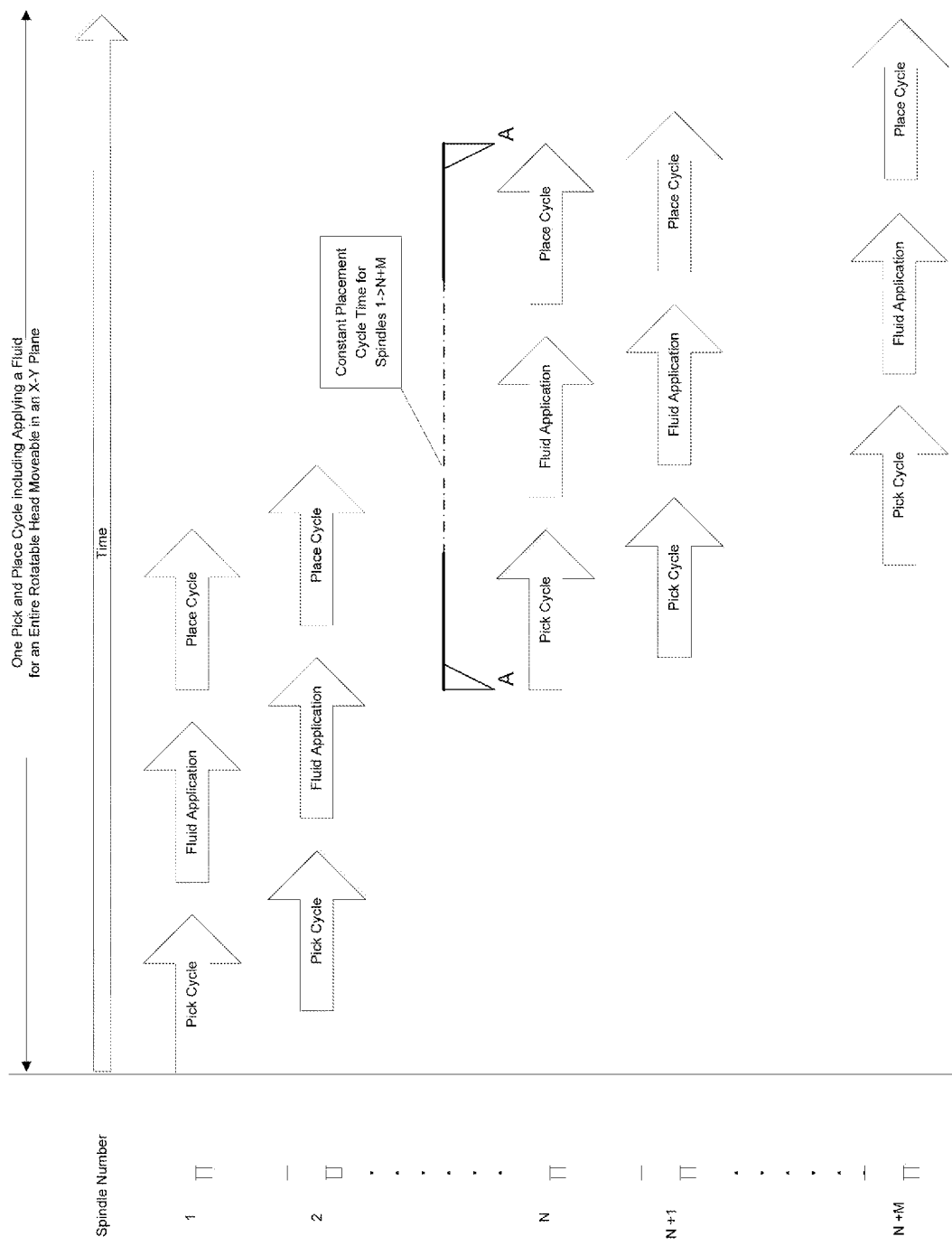

METHOD AND APPARATUS FOR APPLYING FLUID DURING A PLACEMENT CYCLE

FIELD

The subject matter disclosed herein relates to component placement machines. More particularly, the subject matter relates to the application of a fluid to a component during the placement cycle.

BACKGROUND

The use of sophisticated component placement machines in manufacturing printed circuit or similar cards, boards, panels, and the like is well known. The term printed circuit board (PCB) as used herein refers to any such electronic packaging structure. Typically, components are supplied to the placement machine by a variety of feeders. Examples of feeders include tape feeders which hold one or more reels of components, matrix feeders which hold one or more pallets of components, and wafer feeders which hold one or more wafers of dies. All of these feeders provide components at a pick station of some type. A housing carrying a rotatable frame having a plurality of pick and place heads, each pick and place head having a vacuum spindle equipped with a nozzle, may be moved in the X and Y axes in a plane above the PCB being populated. Each vacuum spindle may be moved in the Z-axis (i.e., in and out from an extended to a retracted position). Each nozzle is sized and otherwise configured for use with each different size and style of component to be placed by the machine.

In operation, the housing carrying the rotatable frame is moved to the feeder pick station and the nozzle of one of the pick/place heads is positioned over the component. The nozzle is lowered, via its associated vacuum spindle (i.e., extended) to a point where, upon application of vacuum, the component is removed from the feeder, and held tightly against the vacuum nozzle orifice. The rotatable frame is then moved to a point over the PCB being assembled. The vacuum spindle is then lowered and the component is deposited on the PCB at a predetermined location.

For some processes a component may need to have a fluid, such as flux, an adhesive, or the like, applied prior to placement on the PCB. In this case, the rotatable frame will first move to a fluid application station located in the machine and then extends the spindle such that the fluid is applied to the bottom of the component. Once the fluid is applied, the spindle is raised and the rotatable frame is moved to the PCB. With multi-pick and place head machines, the need to apply fluids to components efficiently to improve cycle rate has become more critical.

In the past, when the nozzle of a particular pick and place head carried a component requiring a fluid be applied, the entire housing and rotatable frame had to be moved in the X-Y plane to a designated fluid application station to apply the fluid to the component. Needless to say, as the entire multi-head rotatable frame needed to move, all other pick/place heads thereupon were prevented from picking and placing components during the trip to the fluid application station. This resulted in lower placement machine throughput because of this motion as would be true even for single pick/place heads.

SUMMARY

According to one embodiment, a component placement machine comprises: a movable housing that is adapted for movement in an X and a Y axis above a printed circuit board, the housing comprising: a rotatable frame having at least one pick and place head configured to pick up a component and place the component on the printed circuit board; and a fluid application station configured to apply fluid to the component after being picked up by the pick and place head and before being placed on the printed circuit board.

According to another embodiment, a method for applying a fluid to a component during a placement cycle comprises: (a) providing a component placement machine including a housing adapted for movement along an X and a Y axis above a printed circuit board and having a frame attached thereto, the frame having a pick and place head disposed thereupon; (b) providing a fluid application station contiguous with the housing and adapted to apply fluid to the component; (c) moving the housing to a pick location; (d) picking the component from a supply of components using the pick and place head; (e) moving the housing to a predetermined location; (f) applying fluid to the picked component; and (g) placing the picked component with the fluid applied onto the printed circuit board at said predetermined location.

According to yet another embodiment, a method for applying a fluid to a component during a placement cycle comprises: (a) providing a component placement machine including a housing adapted for movement along an X and a Y axis above a printed circuit board and having a frame rotatably attached thereto, said frame having a plurality of pick and place heads disposed thereupon; (b) providing a fluid application station attached to the housing and adapted to apply fluid to the component; (c) picking the component from a supply of components using at least one of the plurality of pick and place heads; (d) applying fluid to the picked component; and (e) placing the picked component with the fluid applied onto the printed circuit board at a predetermined location.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

FIG. 5 depicts a cut away view of the on-the-housing fluid application station of FIG. 4 taken at arrows 5-5 according to one embodiment;

FIG. 6 depicts a cut away view of the on-the-housing fluid application station of FIG. 4 taken at arrows 6-6 according to one embodiment;

FIG. 7 depicts a side view of a doctor blade interacting with a belt according to one embodiment;

FIG. 8 depicts a side view of the doctor blade of FIG. 7 leveling a fluid riding on the belt of FIG. 7 according to one embodiment;

FIG. 9 depicts a timing diagram of the placement cycle time according to one embodiment.

DETAILED DESCRIPTION

A detailed description of the hereinafter described embodiments of the disclosed apparatus and method are presented herein by way of exemplification and not limitation with reference to the Figures.

Described herein below is a component placement machine having a housing with a rotatable frame upon which multiple pick and place heads are mounted for assembling PCBs and which includes an integral fluid applicator for applying fluid to components requiring the application of a fluid prior to placement so that there is no need for the rotatable frame to travel in the X-Y plane to a fluid application station to apply a fluid to one or more components.

Figure 1:
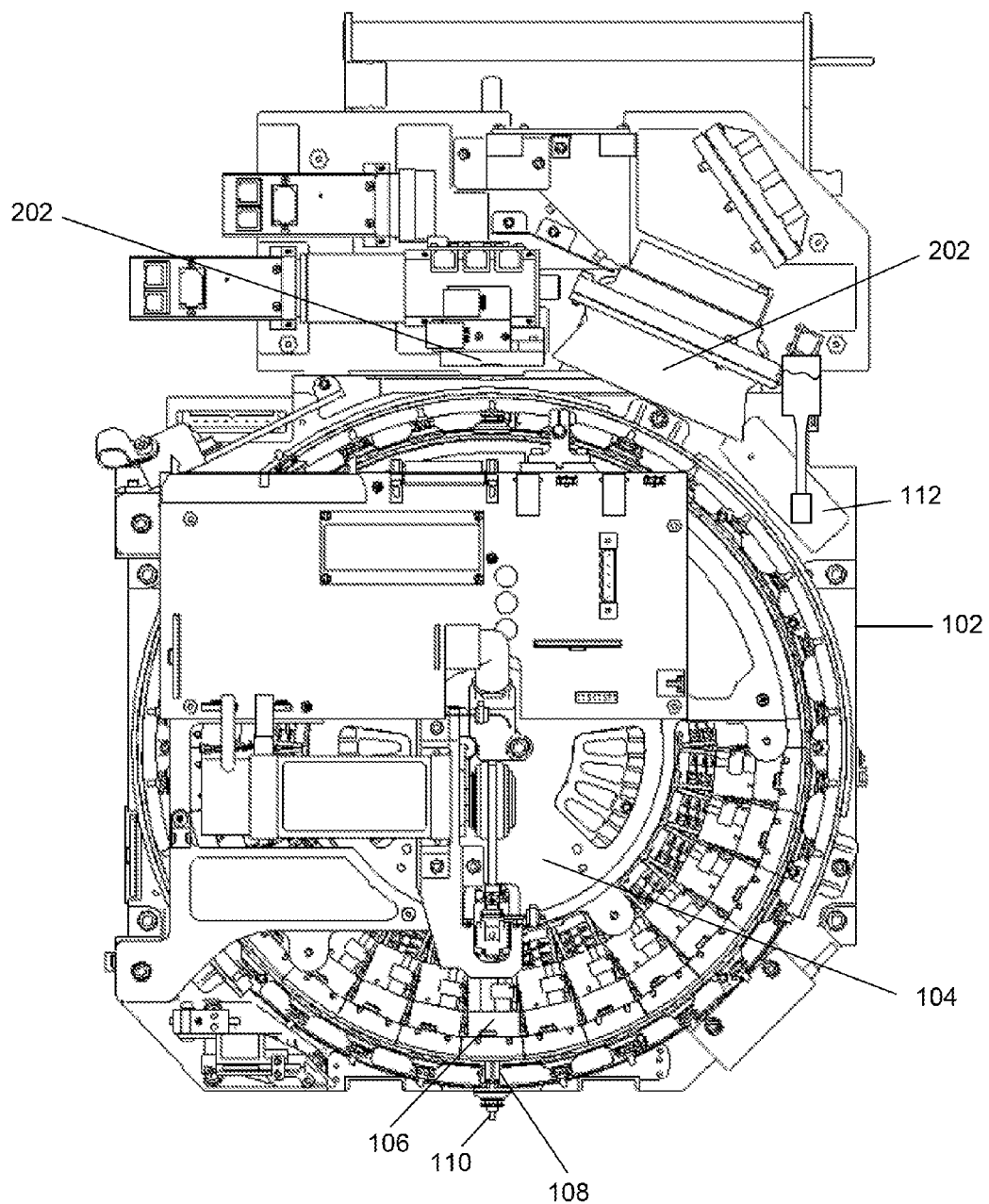
FIG. 1 depicts a detailed, schematic, front elevational view of a rotatable frame having a plurality of pick-up and place heads according to one embodiment.
Figure 2:
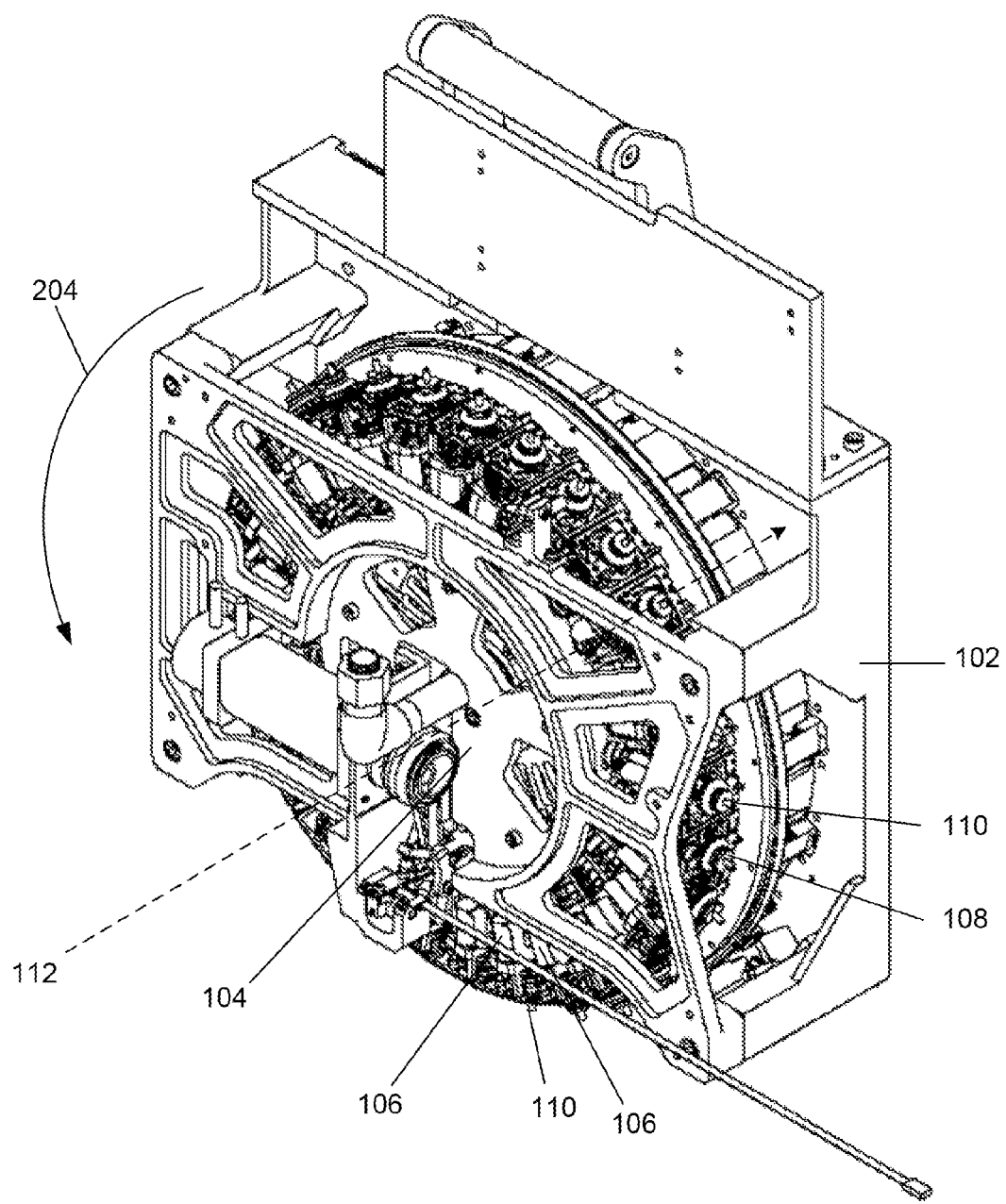
FIG. 2 depicts a detailed, schematic perspective view of the rotatable frame of FIG. 1 according to one embodiment.
Figure 3:
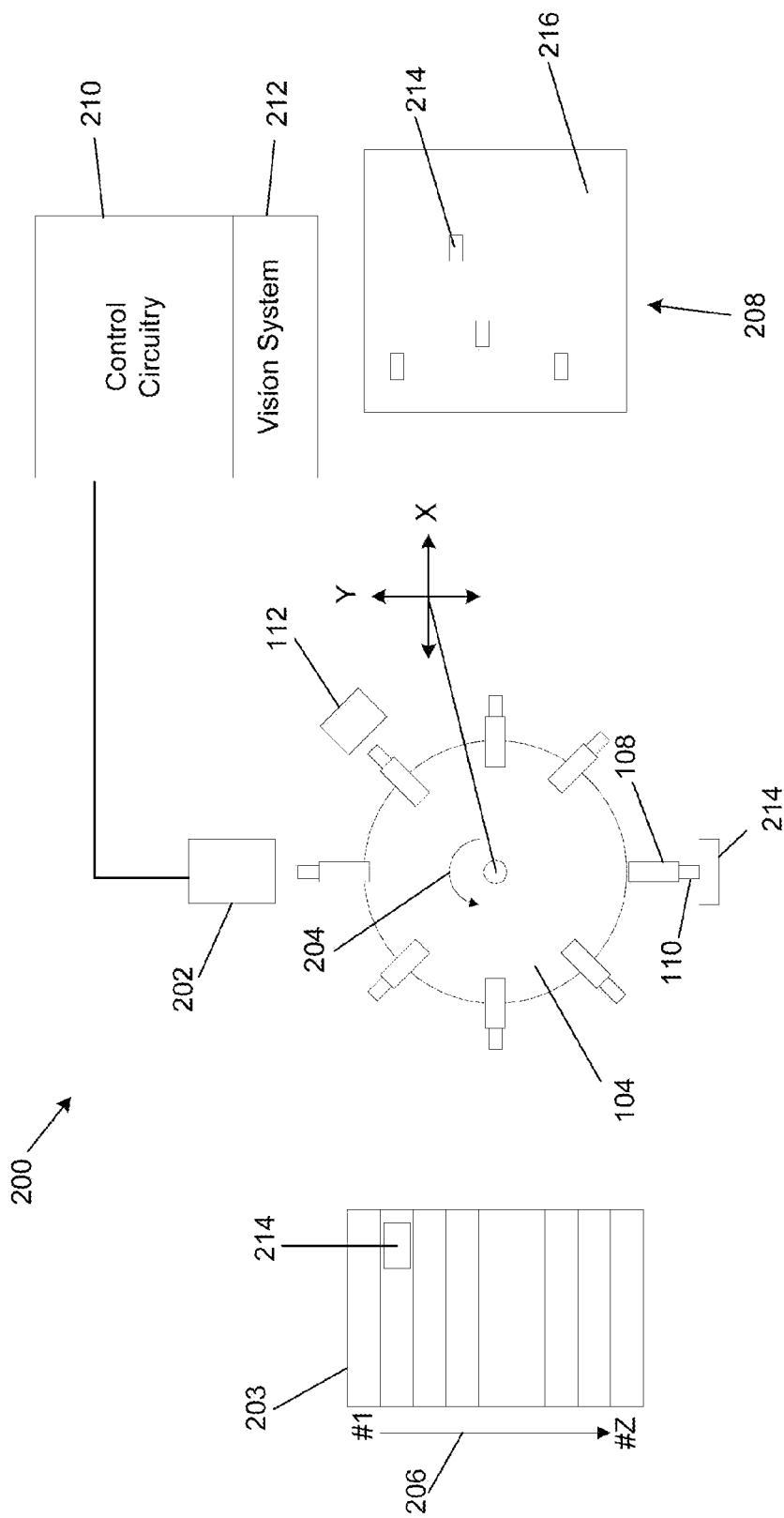
FIG. 3 depicts a simplified schematic block diagram of a portion of a component placement machine according to one embodiment.
Figure 4:
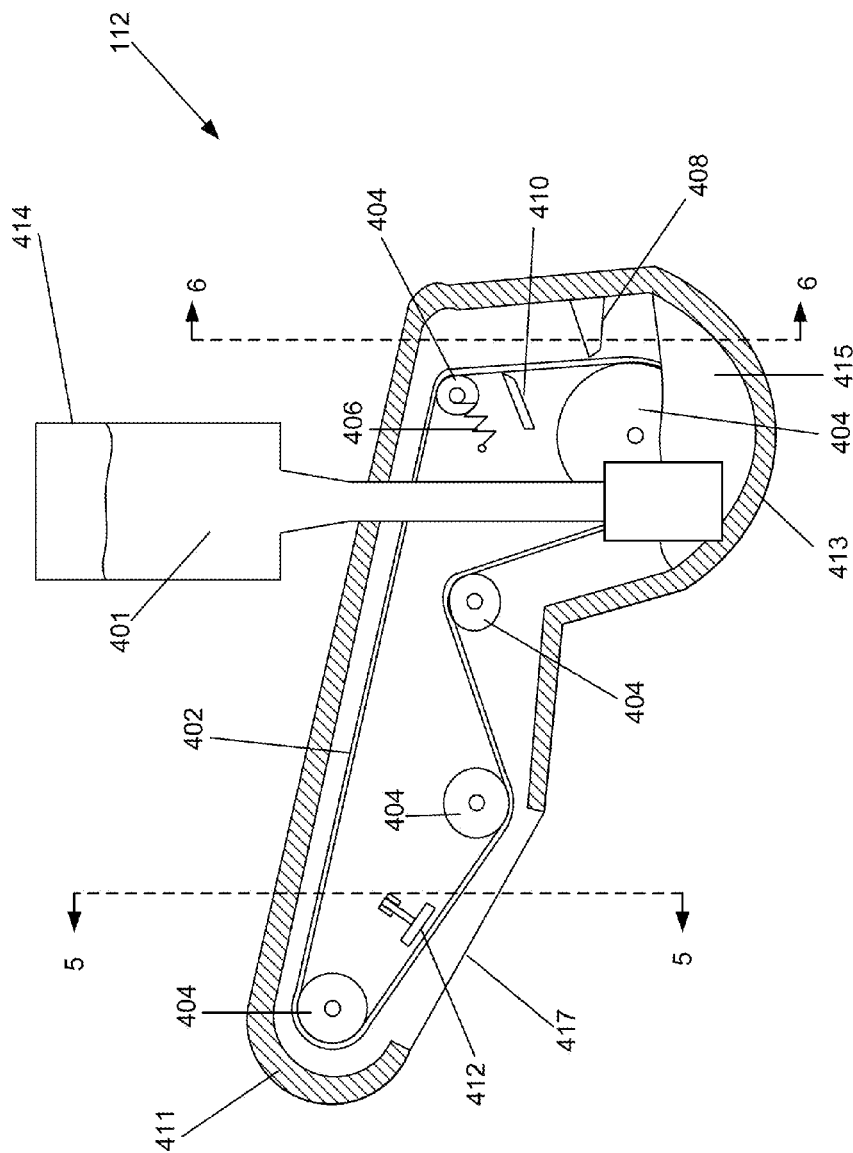
FIG. 4 depicts a detailed perspective view of an on-the-housing fluid application station of the pick-up and place head of FIGS. 1 and 2 according to one embodiment.

Referring firstly to FIGS. 1-3, there is shown a multi-head rotatable frame 104 for use in a component placement machine 200. Particularly, FIG. 1 shows a front elevational view of the rotatable frame 104, FIG. 2 shows a schematic perspective view of the rotatable frame 104, and FIG. 3 shows a simplified schematic block diagram of a portion of the component placement machine 200. The rotatable frame 104 is mounted on a housing 102 and includes a plurality of pick and place heads 106 disposed around the periphery thereof. The rotatable frame 104 rotates around a central axis in the direction indicated by arrow 204. Each pick and place head 106 is shown having a vacuum spindle 108 with a nozzle 110 at a distal end. The vacuum spindle 108 of each pick and place head 106 is movable along a Z-axis between an extended position and a retracted position. In its extended position, the nozzle 110 may pick up a component 214 at a pick station 203. The pick station 203 provides a plurality of different component locations 206 from which a component 214 is selected in accordance with instructions provided, typically by a machine controller 210. The housing 102 to which the rotatable frame 104 is attached may be movable in an X-Y plane, thereby allowing movement between the pick station 203 and a place station 208.

The component placement machine 200 includes an on-the-housing fluid application station 112 which is shown disposed on the housing 102 adjacent to the rotatable frame 104. The on-the-housing fluid application station 112 may be attached to the housing 102 to which the rotatable frame 104 is mounted such that components 214 may have a fluid applied after being picked up by the pick and place heads 106 and prior to their placement on a printed circuit board 216. FIG. 2 shows a desirable location where the on-the-housing fluid application station 112 may be attached. However, it should be understood that the on-the housing fluid application station 112 is not shown in this Figure. The on-the-housing fluid application station 112 will be described in more detail herein below during the detailed description of FIGS. 4-8.

While the rotatable frame 104 is illustrated rotating around a horizontal axis, it should be understood by those skilled in the art that other configurations such as a carousel (not shown) rotating around axes at a different angles are also contemplated. Consequently, the invention is not considered limited to the rotatable frame 104 configuration chosen for purposes of disclosure.

The component placement machine 200 is also shown in the Figures to include a vision system 212. The vision system 212 may include one or more cameras 202 disposed at a process station (not shown) of the component placement machine 200. The vision system 212 may be used to process images of components 214 to facilitate identifying, positioning, and manipulating or otherwise orienting the components 214 held against the nozzle 110 of one or more of the pick and place heads 106. At least one camera 202 may be disposed adjacent the rotatable frame 104 such that components 214 held on the nozzles 110 passing by the camera 202 are inspected. The camera 202 may be used to capture images (not shown) at various magnifications or lighting conditions. The output of the camera 202 may be connected to a machine controller 210 which may include electronic signal processing and control circuitry. The machine controller 210 may control the camera 202 and provides image capture functions. An output of the machine controller 210 may be connected to the vision system 212. A place station 208 may hold one or more printed circuit boards 216 onto which the components 214 are placed. The machine controller 210 may be configured to determine which components are required to receive fluid at the on-the-housing fluid application station 112.

Referring now to FIGS. 4-8, there is shown a perspective view of one embodiment of the on-the-housing fluid application station 112. The fluid application station 112 may include a housing 411 within which fluid application components are housed. As shown, a belt 402 may be mounted on a plurality of rollers 404 located within the housing 411. Tensioning of belt 402 may be accomplished by a spring 406. The spring 406 may be attached to one or more of rollers 404 such that the roller is constantly tensioned into the belt 402 by the spring 406. Rotation of the belt 402 may be accomplished by attaching a motor (not shown) to an axle 418 operable with one of the rollers 404. The axle 418 may extend outside of the housing 411. Thus, the motor may be located outside of the housing. In other embodiments, the axle 418 and motor may each be located within the confines of the housing 411.

A bottle 414 containing a reservoir of fluid 401 may be replaceably attached to on-the-housing fluid application station 112 to ensure a consistent level of fluid within the on-the-housing fluid application station 112. In the embodiment depicted, the bottle 414 may be attached outside of the housing 411 of the on-the-housing fluid application station 112. However, in other embodiments, the bottle 414 may be internal to the housing 411. The bottle 414 may be configured to provide fluid 401 to retain a fluid reservoir or pool of fluid 415 within the housing 411 at a consistent level. The housing 411 may be dimensioned such that it includes a lower portion 413, trough or channel within which the fluid reservoir 415 is configured to accumulate in this controlled manner.

A portion of the belt 402 may be located within the lower portion 413 within the fluid reservoir 415, the belt 402 having both an inner surface and an outer surface. The outer surface hereinafter will refer to the surface of the belt 402 that will eventually apply the fluid to the picked up components 214. Thus, as the belt 402 is rotated, fluid 405 may be applied to the both surfaces of the belt 402. During rotation of the belt 402, a doctor blade 408 levels the fluid (best seen in FIG. 8) on the outer surface of belt 402 and a wiper 410 removes the fluid from the interior surface of belt 402. In the embodiment depicted in FIG. 4, the belt 402 may be configured to rotate in a counterclockwise direction. Thus, the doctor blade 408 and the wiper 410 immediately level and remove, respectively, the fluid after the belt 402 passes through the fluid reservoir 415. However, it should be understood that other embodiments are contemplated that use other leveling means. Alternately, the fluid may be configured to only be applied to the outer surface of the belt 402.

In operation, after a component 214 has been picked up by the pick and place head 106, the component 214 may be presented to the on-the-housing fluid application station 112. Upon indication that a component 214 requiring the application of a fluid prior to placement is in position at the on-the-housing fluid application station 112, a lever arm 416 may press a shoe 412 into the belt 402 such that the belt 402 extends out of an opening 417 in the housing 411 and directly into contact with the component 214 requiring the application of fluid. In this manner, fluid may be applied to component 214. Once the fluid is applied, the lever arm 416 may be returned to the original non-extended position. Movement of the lever arm 416 may be accomplished by a variety of means (not shown) such as a motor or piston. During the application of the fluid to component 214, it should be understood that the belt 402 may either continue rotating or stop during the duration that the fluid being applied to the component 214. In addition, the pick and place heads 106 may be configured to extend towards the raised belt 402 in order to more easily apply the fluid to the component 214.

Once the fluid has been applied by the on-the-housing fluid application station 112, the component 214 may be moved from the on-the-housing fluid application station 112 and placed on the printed circuit board 216 at its predetermined location. In addition, the component 214 may be inspected before or after the application of fluid by the vision system 212, described hereinabove.

The present invention takes advantage of the location of the on-the-housing fluid application station 112 to allow for application of fluid to a component 214 during the placement cycle performed by each nozzle 110 of the component placement machine. It will be recognized that many possible configurations exist for placing the on-the-housing fluid application station 112 in proximity to the rotatable frame 104 that are not limited to the embodiment detailed in the Figures. Additionally, to allow for easy cleaning or replacement of the on-the-housing fluid application station 112, the on-the-housing fluid application station 112 may be removably and replaceably attached to housing 102 via one or more magnets 450. Other attachment means such as screw(s), pin(s), bolts, or other fasteners are also contemplated.

It should be understood that any number of pick and place heads 106 are contemplated. It will also be recognized that the timing data used for purposes of disclosure may vary depending on the actual design of the rotatable frame 104. For instance, only one pick and place head 106 may be mounted onto the housing 102. In this case the fluid application station 112 may be attached to a shuttle mechanism (not shown) mounted on the housing 102 such that after picking the component 214, and while the housing 102 is being moved to the printed circuit board 216, the shuttle mechanism moves the fluid application station 112 under the pick and place head 106 so that fluid may be applied to the component 214 prior to placement onto the printed circuit board 216. Alternatively, both the pick and place head 106 and the fluid application station 112 may be mounted on the housing 102. In this case the pick and place head 106 may move to the fluid application station 112 after picking the component 214 while the housing 102 is being moved to the printed circuit board 216 so that fluid may be applied to component 214 prior to placement on the printed circuit board 216. In both of these scenarios, additional pick and place heads 106 may be mounted using the same principals as described therein.

In any of the embodiments described and shown herein, each pick and place head 106 on the rotatable frame 104 may need to apply a fluid to a component 214 during each placement cycle. It should be understood that the pick and place head 106 contemplated may be fully capable of accommodating such a situation. However, in typical placement circumstances, it will be understood by those skilled in the art that the application of a fluid to a component 214 may only need to be applied to a select few components 214 that are picked up by the rotatable frame 104.

Referring now to FIG. 9, there is shown a timing diagram depicting the application of a fluid to a component, such as the component 214, within a placement cycle. As may be seen, application of a fluid to the component for each pick and place head, such as the pick and place heads 106, may always be completed within a placement cycle. By keeping the application of a fluid to a component that is completely within a single machine placement cycle, the component placement machine's throughput may be unaffected and the overall placement machine's throughput may be improved over similar machines of the prior art that do not include an on-the-housing fluid application station.

Figure 10:
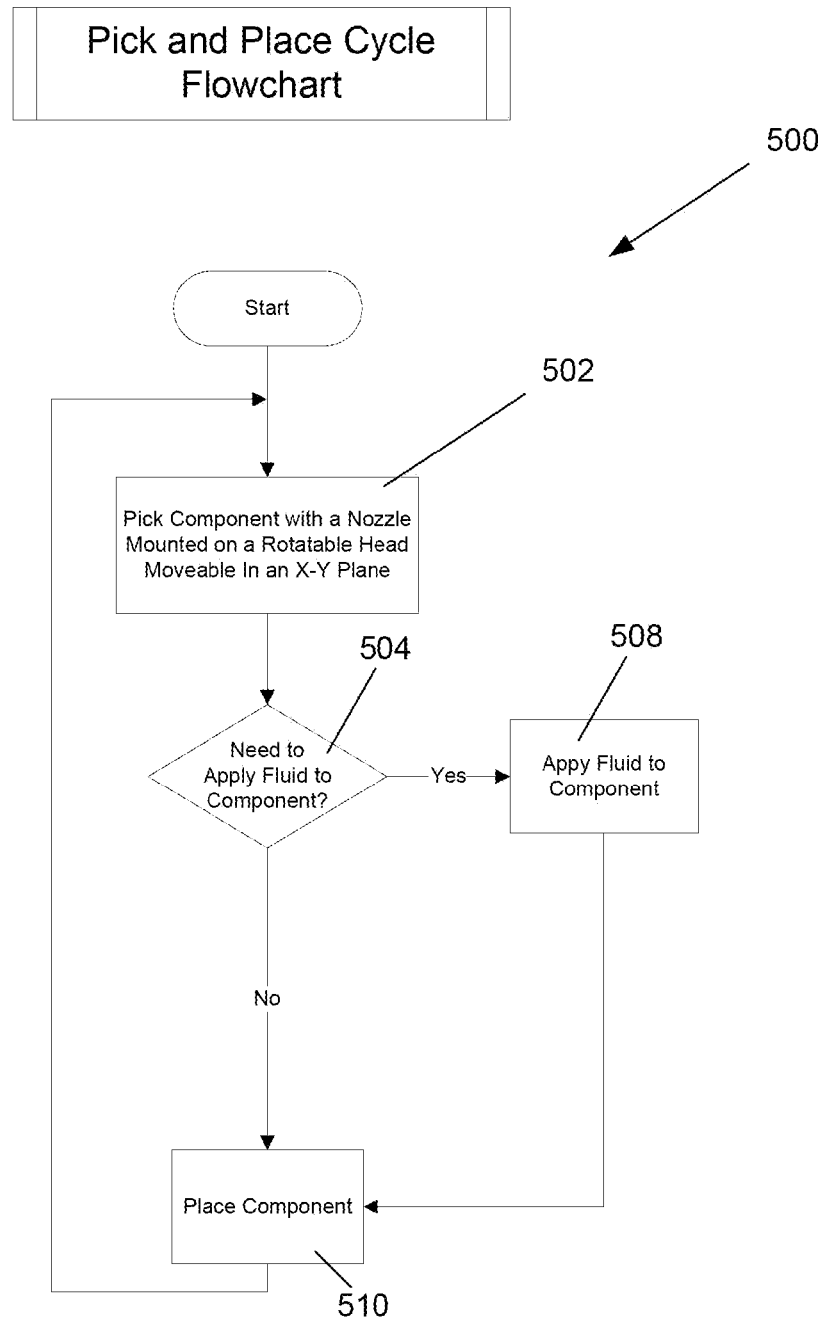
FIG. 10 depicts a simplified flow chart of a method according to one embodiment.

Referring now to FIG. 10, there is shown a flow chart 500 illustrating the steps of a method according to one embodiment of the invention. It should be understood that the method 500 may first include providing a component placement machine that includes a housing adapted for movement along an X and a Y axis above a printed circuit board and having a frame rotatably attached thereto, the frame having a plurality of pick and place heads disposed thereupon. Further, it should be understood that the method includes providing a fluid application station attached to the housing and adapted to apply fluid to the component. A description of embodiments of the elements used to perform the method 500 may be found hereinabove.

The method may include a step 502 of picking up the component 214 from a supply of components with one of the pick and place heads 106. Particularly, the picking up may be accomplished with the nozzle 110, mounted on the rotatable frame 104. At this step, the rotatable frame 104 may be first moved to the pick station 203 and the nozzle 110 may be lowered, and the component 214 may be picked up. This step is repeatable for the number of pick and place heads 106 that may be on the multi-head rotatable frame 104.

After component picking begins, an inquiry step 504 of determining whether fluid needs to be applied may be performed. Then, if fluid needs to be applied, component 214 may have a fluid applied by the on-the-housing station 112, at step 508. This may take place, for example, while a next nozzle 110 picks up a next component 214, until the first component 214 reaches the on-the-housing fluid application station 112. Once fluid is applied to the component 214, the rotatable frame 104 may be moved under program control to the desired X-Y coordinates over the printed circuit board 216 being assembled at the place station 208. The nozzle 110 may then be lowered and the component 214 that was previously picked up in step 502 may now be placed onto the printed circuit board 216 in step 510.

Alternatively, after component picking begins, the nozzles 110 holding a picked component 214 may proceed to the camera 202 where the component 214 is imaged, and the vision system 212 processes the acquired image. This step may occur either before or after fluid application step 504 depending on the location of vision system 212 to fluid application station 112. In alternate embodiments, the component placement machine 200 having the on-the-housing fluid application station 112 mounted on the housing 102 may have different fluid application options programmed. In one alternate embodiment, a component 214 being picked and placed by the component placement machine 200 may be physically too large to be accommodated by the on-the-housing fluid application station 112. In this case, the component placement machine 200 may automatically revert to prior art behavior and move the housing 102 along the X and Y axes to a typical prior art fluid application station where each oversized component may have fluid applied.

In one particular instance, the fluid being applied may be flux. However, other fluids such as adhesives or other wetting agents may be applied. For instance, a spray adhesive, which may be stored in a pressurized container, may need to be applied. In the case, the bottle 414 may be replaced by the pressurized container, the lever arm 416 may replaced with means to cause the pressurized container to spray the adhesive when component 214 is in position at the on-the-housing fluid application station 112, and belt 402, rollers 404, spring 406, and shoe 412 may not be necessary.

Furthermore, the method 500 may include repeating the picking, applying fluid, and placing additional components. The picking of the additional component may be accomplished substantially during the application of fluid step of a previously picked up component 214. Furthermore, the placing step of the originally picked up component 214 may be accomplished during the application of fluid step to the additional component. Furthermore, the method 500 may include removing the fluid application station 112 from the housing 102 for easier access to the fluid application station 112 and reattaching the fluid application station to the housing.

Elements of the embodiments have been introduced with either the articles "a" or "an." The articles are intended to mean that there are one or more of the elements. The terms "including" and "having" and their derivatives are intended to be inclusive such that there may be additional elements other than the elements listed. The conjunction "or" when used with a list of at least two terms is intended to mean any term or combination of terms. The terms "first" and "second" are used to distinguish elements and are not used to denote a particular order.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

I claim:

1. A method for applying a fluid to a component during a placement cycle, the method comprising:
   (a) providing a component placement machine including a housing, the housing adapted for movement along an X and a Y axis above a printed circuit board, the housing having a frame attached thereto, the frame having a pick and place head disposed thereupon;
   (b) providing a fluid application station contiguous with the housing and adapted to apply fluid to the component;
   (c) moving the housing to a pick location;
   (d) picking the component from a supply of components using the pick and place head;
   (e) moving the housing to a predetermined location;
   (f) applying fluid to the picked component; and
   (g) placing the picked component with the fluid applied onto the printed circuit board at said predetermined location;
   wherein said fluid application step (f) is accomplished at least substantially during at least one of said moving step (e), and said placing step (g).

2. The method of claim 1, further comprising rotating a belt of the fluid application station, wherein the belt is configured to apply the fluid to the picked component in step (f).

3. The method of claim 1, further comprising removing the fluid application station from the housing for easier access to the fluid application station and reattaching the fluid application station to the housing.

4. The method of claim 1, further comprising:
   determining if fluid needs to be applied the picked component; and
   performing step (g) only for those picked components determined to require the application of fluid.

5. The method of claim 1, further comprising:
   providing a plurality of pick and place heads on the frame; and
   repeating at least steps (d), (e) and (g) for an additional component.

6. A method for applying a fluid to a component during a placement cycle, the method comprising:
   (a) providing a component placement machine including a housing, the housing adapted for movement along an X and a Y axis above a printed circuit board, the housing having a frame rotatably attached thereto, said frame having a plurality of pick and place heads disposed thereupon;
   (b) providing a fluid application station attached to the housing and adapted to apply fluid to the component;
   (c) picking the component from a supply of components using at least one of the plurality of pick and place heads;
   (d) applying fluid to the picked component;
   (e) moving the housing to a predetermined location; and
   (f) placing the picked component with the fluid applied onto the printed circuit board at a the predetermined location;
   further comprising repeating steps (c) to (e) for an additional component, wherein said fluid application step (d) is accomplished at least substantially during at least one of said repeated picking step (c) of the additional component.

7. The method of claim 6, wherein said placing step (e) is accomplished substantially during the repeated fluid application step (d) for the additional component.

8. The method of claim 6, wherein said fluid application step (d) comprises means for extending at least one of a plurality of the pick and place heads such that the fluid is applied to the component by the fluid application station.

9. The method of claim 6, further comprising determining whether fluid needs to be applied to the picked component and performing step (g) only for those picked components determined to require the application of fluid.

10. The method of claim 6, further comprising removing the fluid application station from the housing for easier access to the fluid application station and reattaching the fluid application station to the housing.

* * * * *

UNITED STATES PATENT AND TRADEMARK OFFICE
CERTIFICATE OF CORRECTION

| | |
|---|---|
| PATENT NO. | : 8,898,893 B2 |
| APPLICATION NO. | : 12/968385 |
| DATED | : December 2, 2014 |
| INVENTOR(S) | : Koenraad Gieskes |

It is certified that error appears in the above-identified patent and that said Letters Patent is hereby corrected as shown below:

In the Claims

In Column 8, Line 40, delete "a" after the word "at."

Signed and Sealed this
Eleventh Day of August, 2015

Michelle K. Lee
*Director of the United States Patent and Trademark Office*